United States Patent [19]

Uwai et al.

[11] Patent Number: 5,993,596
[45] Date of Patent: Nov. 30, 1999

[54] PLASMA-ETCHING ELECTRODE PLATE

[75] Inventors: Toshiharu Uwai, Gotemba; Takeshi Matsuoka, Shizuoka; Tomio Hata, Chigasaki, all of Japan

[73] Assignee: Tokai Carbon Company, Ltd., Tokyo, Japan

[21] Appl. No.: 08/799,957

[22] Filed: Feb. 14, 1997

[30] Foreign Application Priority Data

Feb. 15, 1996 [JP] Japan ................................. 8-052467

[51] Int. Cl.⁶ ..................................................... H05H 1/46
[52] U.S. Cl. ..................................... 156/345; 204/298.31
[58] Field of Search ........................ 156/345; 118/723 E; 204/198.07, 298.14, 298.33, 298.34

[56] References Cited

U.S. PATENT DOCUMENTS 5,074,456  12/1991  Degner et al. ....................... 156/345 X
5,324,411   6/1994  Ichishima et al. ................... 156/345 X

*Primary Examiner*—Thi Dang
*Attorney, Agent, or Firm*—Flynn, Thiel, Boutell & Tanis, P.C.

[57] ABSTRACT

A plasma-etching electrode plate of glassy carbon is characterized by a thickness greater than 4.5 mm and a thermal conductivity greater than 5 W/m·K at 300K. Due to these characteristic properties, it has a uniform surface temperature distribution and permits etching on large semiconductor wafers (in excess of 8 inches in diameter) at a uniform etch rate. In addition, it is capable of stable etching for a long time and has a greatly improved durability. The glassy carbon should preferably be one which has a bulk specific gravity higher than 1.53 g/cc. The glassy carbon is obtained from one or more of thermosetting resin having a carbon yield higher than 20%.

5 Claims, 3 Drawing Sheets

PLASMA-ETCHING ELECTRODE PLATE

FIELD OF THE INVENTION

The present invention relates to an improvement in the plasma-etching electrode plates used in plasma etching of a wafer or silicon oxide film formed thereon for the production of semiconductor devices. More particularly, the present invention relates to an improvement in plasma-etching electrode plate produced from a carbonaceous material.

To be more specific, the present invention relates to a plasma-etching electrode plate made of glassy carbon which permits uniform etching of large wafers (8 inches or up in diameters). The plasma-etching electrode plate of the present invention is used for the etching of a silicon oxide film on a wafer in the production of semiconductor integrated circuits. It is suitable for the plasma etching system of the shower type equipped with parallel plate electrodes.

BACKGROUND OF THE INVENTION

The plasma etching process employs an apparatus as disclosed in U.S. Pat. No. 4,534,816, Lee Chen, "Single Wafer Plasma Etch Reactor" (issued Aug. 13, 1985), U.S. Pat. No. 4,780,169, Mark M., "Non-uniform Gas inlet for Dry Etching Apparatus" (issued Oct. 25, 1988), U.S. Pat. Nos. 5,423,936, 5,445,709, and others.

The disclosed apparatus is provided with paired parallel plate electrodes facing each other. One of them is located at the lower part of the chamber so that wafers (substrates) are placed on it. Another of them is located at the upper part of the chamber and has a number of small through holes for gas introduction. For etching, this apparatus applies a high-frequency electric power across the electrodes to induce discharge while introducing a reactive gas (such as a halogen gas and freon gas) through the upper electrode. The resulting gas plasma attacks that part of the substrate which is not protected by the photoresist. In this way accurate fine circuit patterns are formed on the semiconductor wafer.

The upper electrode for plasma etching is a disk having a number of small through holes as shown in Lee Chen's patent (FIG. 2) or Mark's patent (FIG. 3A). It varies in shape, number, and arrangement of small holes depending on the apparatus and etching conditions. (In other words, not all electrodes of the same type can be used in common for any apparatus.) The shape of small holes strictly depends on the kind of electrode for individual apparatus.

Additional requirements for the electrode plate include good electrical conductivity, high purity (to prevent wafer contamination), and chemical stability (to protect itself from etching). To meet these requirements, early electrodes were made of aluminum, stainless steel, or carbon (graphite). Electrode plates made of glassy carbon have come into general use recently.

Glassy carbon is a hard, macroscopically non-porous carbonaceous substance obtained by carbonization of a thermosetting resin. It is characterized by a high strength, chemical inertness, gas impermeability, self-lubrication, toughness, and purity. Another advantage over other materials is that it has the least likely possibility of fine particles releasing themselves from the structure to contaminate the wafer during plasma etching.

The ever-increasing degree of integration needs plasma-etching electrodes to meet requirements for configuration as well as physical and chemical properties. In other words, the plasma-etching electrodes should be at least liable to wafer contamination with particles and to wearing. Efforts have been made to improve the plasma-etching electrodes of glassy carbon.

Some examples of improvements are as follows.

(1) A glassy carbon material for a plasma apparatus which is characterized by having a porosity of 0.0002–0.0020%, a crystallite undetectable by X-ray diffraction, and an impurity content lower than 5 ppm. In other words, it has improved purity, porosity, pore diameter, and crystalline structure. (Japanese Patent Laid-open No. 33007/1991)

(2) A plasma-etching electrode plate of high-purity glassy carbon having the structure characterized by having a pore diameter smaller than 1 $\mu$m (maximum) or 0.7 $\mu$m (average) and a porosity lower than 1%. (EP421668B1)

(3) A plasma-etching electrode plate (thicker than 2 mm) of high-purity glassy carbon which is substantially free of grain boundaries in the surface and inner structure and has a pore diameter smaller than 1 $\mu$m (maximum). (Japanese Patent Laid-open No. 285086/1991)

(4) A plasma-etching electrode plate of glassy carbon characterized by having an ash content lower than 5 ppm, metal impurities lower than 2 ppm, a total sulfur content lower than 30 ppm, a specific gravity higher than 1.50, a flexural strength higher than 1100 kg/cm$^2$, and a crystalline structure with a crystal interlayer distance (002) smaller than 0.375 nm and a crystallite size (002) larger than 13 nm. (Japanese Patent Laid-open No. 320955/1993)

(5) A plasma-etching electrode plate of glassy carbon composed of crystals having a lattice constant smaller than 6.990 Å. (Japanese Patent Laid-open No. 128761/1994)

(6) A plasma-etching electrode plate of glassy carbon having a surface roughness ($R_{max}$) lower than 6 $\mu$m at that part of the surface which is subject to wear by plasma. (Japanese Patent Laid-open No. 128762/1994)

(7) A plasma-etching electrode plate of glassy carbon made of a phenolic resin and a polycarbodiimide resin. (Japanese Patent Laid-open No. 347270/1993)

(8) A plasma-etching electrode plate of glassy carbon made of a polycarbodiimide resin. (Japanese Patent Laid-open No. 347278/1993)

(9) A thick glassy carbon plate made by the process disclosed in Japanese Patent Laid-open Nos. 362062/1992 and 100365/1994.

One of the important factors to be considered in plasma etching is the rate of etching. For accurate fabrication, it is necessary to maintain a uniform etch rate. Achieving this objective depends on the temperature of the reaction chamber and especially on the temperature distribution on the electrode surface. Any variation in the surface temperature prevents uniform, stable etching.

A common way to keep uniform the surface temperature of a thin electrode plate (which becomes hot due to plasma irradiation) is to tightly attach a cooling metal plate to the back of the electrode plate. A problem in this case is with the warp of the electrode plate. The thinner the electrode plate, the more liable it is to warp. Warp forms a small gap which prevents close contact between the electrode plate and the cooling metal plate, resulting in insufficient heat dissipation. Therefore, it is necessary to devise a method for minimizing warp.

The electrode plate should preferably be thick rather than thin from the standpoint of durability. Good durability prolongs the interval between shutdowns for electrode replacement.

The uniformity of etch rate is important for accurate etching in view of the fact that finer circuit patterns are necessary for semiconductor de vices with a higher degree of integration and the wafer size has exceeded 8 inches and is expected to exceed 12 inches in the near future. Nevertheless, no efforts have been made to improve the uniformity of etch rate from the material viewpoint of the glassy carbon constituting the electrode.

The etch rate is governed mainly by the temperature of the reaction system. In the case of a thick electrode plate, it is important for the uniform etch rate to keep uniform the temperature distribution on the electrode surface. The thick electrode plate of glassy carbon proposed in Japanese Patent Laid-open Nos. 362062/1992 and 100365/1994 mentioned above has be en found unsatisfactory for plasma etching.

SUMMARY OF THE INVENTION

In order to address problems involved in the conventional plasma-etching electrode plate of glassy carbon, the present inventors thoroughly investigated the relation between the properties of the electrode plate and the etch rate. As the result, it was found that it is possible to keep uniform the temperature distribution on the electrode surface and hence to carry out uniform etching invariably, if the electrode plate is made of glassy carbon having a thermal conductivity greater than a specific value and a thickness greater than a specific value. This finding led to the present invention.

It is an object of the present invention to provide a plasma-etching electrode plate of glassy carbon which keeps its surface temperature distribution uniform and hence permits etching to proceed uniformly and also permits stable etching of large wafers (in excess of 8 inches in diameter) over a long period of time.

The above-mentioned object is achieved by a plasma-etching electrode plate of glassy carbon which is characterized by a thickness greater than 4.5 mm and a thermal conductivity greater than 5 W/m·K at 300K.

According to the present invention, the plasma-etching electrode plate is thicker than 4.5 mm so that it has a uniform, stable temperature and also has a uniform temperature distribution on its surface exposed to the plasma. These characteristics properties contribute to the uniform etch rate of semiconductor wafers. Thus, the plasma-etching electrode plate should be a flat disk of glassy carbon having a number of through holes, should and have a bulk specific gravity greater than 1.53 g/cc (measured after polishing) and a thermal conductivity greater than 5 W/m·K at 300K.

DETAILED DESCRIPTION OF THE PREFERRED EMBODIMENTS

Figure 1:
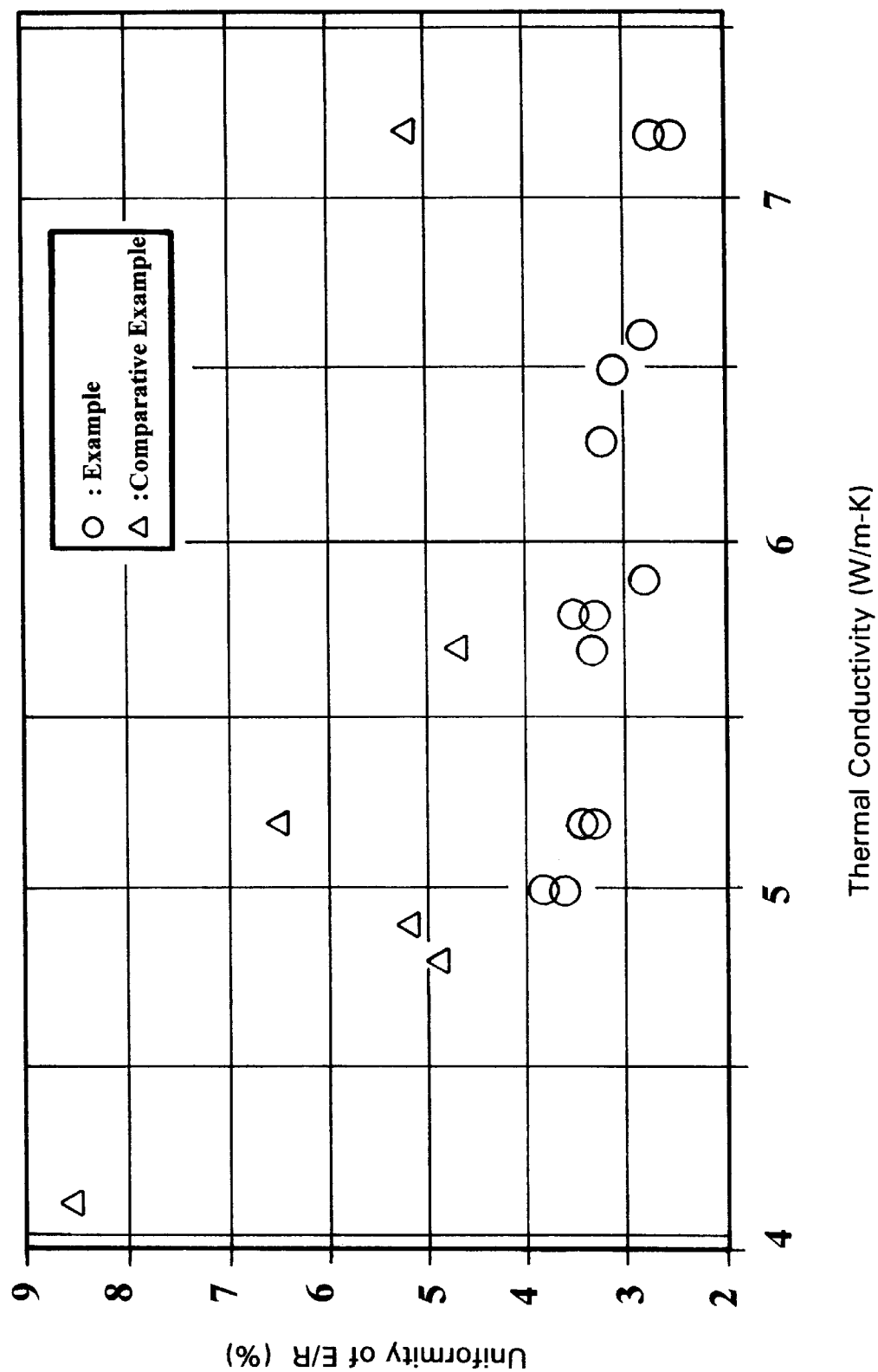
FIG. 1 is a graph showing the relationship between the thermal conductivity and the uniformity of etch rate after etching for 200 hours.

The plasma-etching electrode plate of the present invention is a glassy carbon plate of uniform structure which is obtained by baking (for carbonization) a thermosetting resin having a carbon yield higher than 20%. (The carbon yield means the amount of carbon content (in wt %) which remains after baking at 800–1000° C. in a nonoxidizing atmosphere.) It should have a high purity specified by less than 5 ppm of total ash content, less than 2 ppm of metal impurities, and less than 30 ppm of total sulfur content. In addition, it should be as flat as possible. These requirements should be met to prevent the diffusion of impurities into the wafers and the contamination of the wafers with fine particles.

According to the present invention, the important physical properties required of the plasma-etching electrode plate are a thickness greater than 4.5 mm, a thermal conductivity greater than 5 W/m·K at 300K, and a bulk specific gravity greater than 1.53 g/cc.

The thermal conductivity and thickness specified above mean that the glassy carbon plate conducts heat well and has a large heat capacity. Due to these properties, the electrode plate has a uniform temperature distribution on its surface with a minimum of temperature fluctuation. This temperature uniformity contributes to the uniform etch rate. These effects are enhanced by the high bulk specific gravity. The high bulk specific gravity also contributes to the resistance to wear by the plasma.

With a thermal conductivity lower than 5 W/m·K at 300K and a thickness smaller than 4.5 mm, the electrode plate of glassy carbon is liable to temperature fluctuation due to heat generation resulting from plasma etching. This aggravates the uniformity of etch rate.

An advantage of the thick electrode plate of glassy carbon is a high heat capacity, which eliminates the problem with warp encountered in thin electrode plates. (Warp prevents the close contact of the cooling metal plate.) It is possible for the thermally conductive, thick electrode plate to effectively suppress the fluctuation of the surface temperature distribution and hence to realize a uniform etching rate. An additional advantage of the thick electrode plate is the capability of handling large wafers and a long life.

The glassy carbon plate meeting the above-mentioned requirements can be produced from a resin composition by moldings curing, and baking (for carbonization) in a non-oxidizing atmosphere. The resin composition is composed of a phenolic resin (having a molecular weight higher than 100 and a gelling time of 5–60 minutes) and furan or a derivative thereof. It is a liquid having a viscosity of 1–100 poise and containing more than 50 wt % resin.

In general, the thick glassy carbon plate tends to vary in structure (such as crystallinity and density) across its thickness. In an extreme case, the variation in structure leads to cracking during heat treatment. However, it is possible to produce the glassy carbon plate meeting the above-mentioned requirements by strictly controlling the composition of the raw materials and the conditions of the manufacturing process such as the rate of heating (for curing) and the maximum temperature and pressure for baking (for carbonization).

The following is an adequate process for producing the plasma-etching electrode plate of glassy carbon that meets the requirements specified in the present invention.

(1) Preparation and molding of raw material resin

First, a phenolic resin precondensate is prepared from purified phenol and formalin by a condensation reaction. It has a molecular weight higher than 100 and a gelling time of 5–60 minutes. Then, it is mixed with furan or a derivative thereof. Thus, there is obtained a binary resin composition having a yield of carbonization of 65–75%. The examples of the furan derivative include furfuryl alcohol, furfural, and methyl ester of furancarboxylic acid, which are miscible with phenolic resins. They may be used alone or in combination with one another. The mixing ratio of furan to phenolic resin should be established adequately so that the resulting composition has a viscosity of 1–100 poise and contains more than 50% resin.

The resin composition is formed into a disk by casting, centrifugal molding, or injection molding so that the eventually obtained glassy carbon plate in thicker than 4.5 mm. The molded disk is cured by heating.

A polycarbodiimide as the raw material may be obtained from a mixture or copolymer of aliphatic, alicyclic, or aromatic isocyanates, such as 2,4-tolylenediisocyanate, 2,6-tolylenediisocyanate, a mixture thereof, crude tolylenediisocyanate, xylenediisocyanate, m-phenylenediisocyanate, naphthylene-1,5-diisocyanate, 4,4'-biphenylenediisocyanate, and 3,3'-dimethoxy-4,4'-biphenylenediisooyanate. It may be prepared by the process disclosed in Japanese Patent Laid-open Nos. 61599/1986 and 299316/1990. The organic diisocyanate is reacted in the presence of a polymerization catalyst and the resulting product (with solvent removed) is formed and cured by heating.

(2) Curing

Curing should be carried under strictly controlled conditions. Uneven curing leads to uneven carbon crystallization across the thickness of the glassy carbon plate. In general, the curing of a thermosetting resin is exothermic and curing proceeds faster in the outer layer than in the inner layer. Rapid heating to accelerate dewatering and drying causes the outer layer to solidify and densify faster than the inner layer. The solid outer layer prevents the release of water or reaction gas which is formed in the molded disk by curing reaction.

To avoid uneven curing, it is necessary to raise the heating temperature at a rate lower than 10° C./h, preferably lower than 5° C./h, more preferably lower than 2° C./h. The maximum temperature should be maintained for a while until curing is completed. The curing temperature varies depending on the resin composition, hardener, and formulation. It is usually in the range of 140–200° C. (or 200–250° C. for polycarbodiimide resin). Complete curing will take more than several hours.

(3) Carbonization

After curing, the resin molded product is heated (for baking and carbonization) at 900° C. or above in a furnace with a nonoxidizing atmosphere. In this way, there is obtained a glassy carbon plate. Heating in this step should be uniform because the resin molded product has a low thermal conductivity and hence carbonization proceeds faster in the outer layer than in the inner layer. To ensure uniform heating and carbonization, it is necessary to raise the temperature slowly at a rate lower than 2° C./h.

Glassy carbon is gas-impermeable and has a large number of extremely small pores therein because it is amorphous, unlike crystalline graphite. Rapid carbonization closes the pores in the glassy carbon, resulting in a low bulk specific gravity. In addition, the remaining pores produce a heat insulating effect and hence lower the heat capacity of the glassy carbon.

Open-cell structure and cell growth leading to voids should be avoided; porous products are weak and liable to cracking during carbonization and the desired thick product cannot be obtained. In addition, pores form edges when they are exposed as the surface of the electrode wears out and such edges easily drop off to become particles. The possibility of this trouble is proportional to the number of pores present.

After curing, the resin molded product is held between graphite plates under pressure, and the assembly is placed in a graphite crucible and baked (for carbonization) in a heating furnace at 800–2500° C., with the temperature in the furnace adequately controlled. In this way it is possible to produce several grades of glassy carbon plates which vary in thermal conductivity.

For uniform carbonization, it is desirable to hold the temperature constant for a certain period of time at each stage of heating. For example, the stage of vigorous decomposition, the stage of vigorous gas evolution, and the stage of structure change following carbonization. To be specific, it is desirable to keep the temperature at 300–400° C., 400–4000° C., and 500–600° C. at these stages, respectively, for more than 5 hours. This procedure is necessary to obtain a glassy carbon material having a high bulk specific gravity and a high thermal conductivity, because the continuous temperature rise (even at a low rate of 2° C./h) causes the internal pressure to rise rapidly due to the expansion of pores resulting in breakage.

The effect concomitant to reducing the number of pores is the effective protection of the electrode against breakage and excessive consumption by wear during use. The result is uniform wear on the electrode surface and hence an improved etch rate.

Another way to obtain the desired thick product is to incorporate the raw material with a carbonaceous material, an easily carbonizable organic compound, or a metallic element or compound capable of combining with water or gas evolved by reaction. The substance for this purpose should be a particulate finer than 2 $\mu$m so as to avoid the problem with particles falling on the wafer that develops as the electrode is consumed.

(4) Purification

After baking and carbonization, the glassy carbon plate is purified further by heating at 1400° C. or above in an electric furnace through which a halogen gas (such as chlorine) is passed according to need.

(5) Hole drilling

The small through holes for gas introduction may be formed in the electrode plate in the stage of molding from a resin or after the step of carbonization. In the first case, the size of the hole should be determined in anticipation of the shrinkage that occurs during baking. In the second case, drilling may be accomplished by electro arc machining.

EXAMPLES

The invention will be described in more detail with reference to the following examples and comparative examples which are not intended to restrict the scope of the invention. The raw material that can be used in the examples is a phenolic resin, furan resin, polyamide resin, or polycarbodiimide resin, or a mixture thereof which has a carbon yield higher than 20%.

Examples 1 to 12 and Comparative Examples 1 to 6

(1) Production of plasma-etching electrode plate

These examples demonstrate the production of plasma-etching electrode plates from a phenol-furan resin.

A precondensate of a phenolic resin was prepared from phenol (purified by distillation under reduced pressure) and formalin. It had the molecular weight and gelling time shown in Table 1. This phenolic resin (100 pbw) was combined with furfuryl alcohol (30 pbw) to give a resin composition having a viscosity of 40 poise and containing 55% resin.

The resin composition was cast into a polyethylene vat, deaerated under reduced pressure (10 Torr) in a vacuum desiccator, and heated in an electric oven up to 200° C. at a rate of 4° C./h and kept at this temperature for 5 hours. In this way there was obtained a molded product in the form of a plate.

The molded product was held between two flat graphite plates (G347, from Tokai Carbon Co., Ltd.) 10 mm thick. The assembly was placed in a graphite crucible and baked (for carbonization) in an electric furnace with an argon atmosphere.

Baking was carried out by raising the temperature at a rate of the 1–4° C./h, with the pressure of argon atmosphere varied in the electric furnace. The heating stage was held stationary for 5 hours each, at 350° C., 450° C., and 550° C. The baking temperature and the furnace pressure are shown in Table 1.

With the furnace temperature kept unchanged, chlorine gas was introduced into the furnace for purification. Thus there was obtained several samples of flat glassy carbon plates which vary in diameter and thickness.

The glassy carbon plate had through holes (0.5 mm in diameter) made by electro arc machining at equal intervals of 2 mm at its central part. Thus there was obtained the desired plasma-etching electrode plate.

The physical properties of the plasma-etching electrode plate are shown in Table 2. Thermal conductivity was measured according to JIS R1611-1991. Specific heat capacity was measured by using high-purity α-alumina as the reference and blackened aluminum as the light receiving plate. Heat diffusion rate was measured by using high-purity copper as the reference. Bulk specific gravity was measured by the Archimedes method (weighing the object in a liquid) according to JIS Z8807-1987.

(2) Evaluation of the electrode plate

Each sample of the electrode plate (mounted on the plasma-etching system) was tested for the uniformity of etch rate by the actual etching of an oxide film on an 8-inch silicon wafer for 100 hours and 200 hours. The results are shown in Table 3. The etching conditions are as follows.

Reaction gas: $CF_4$

Carrier gas: Argon

Chamber pressures 1 Torr

Frequency of power: 13.5 MHz

Wear in Table 3 represents the decrease in thickness of the electrode plate measured after etching. The uniformity of etch rate was calculated from the following formula.

$$\text{Uniformity (\%)} = \frac{\text{Maximum value} - \text{Minimum value}}{\text{Maximum value} + \text{Minimum value}} \times 100$$

where the maximum value and minimum value are selected from the data of etch rate measured at nine points (including the center of the wafer).

Figure 2:
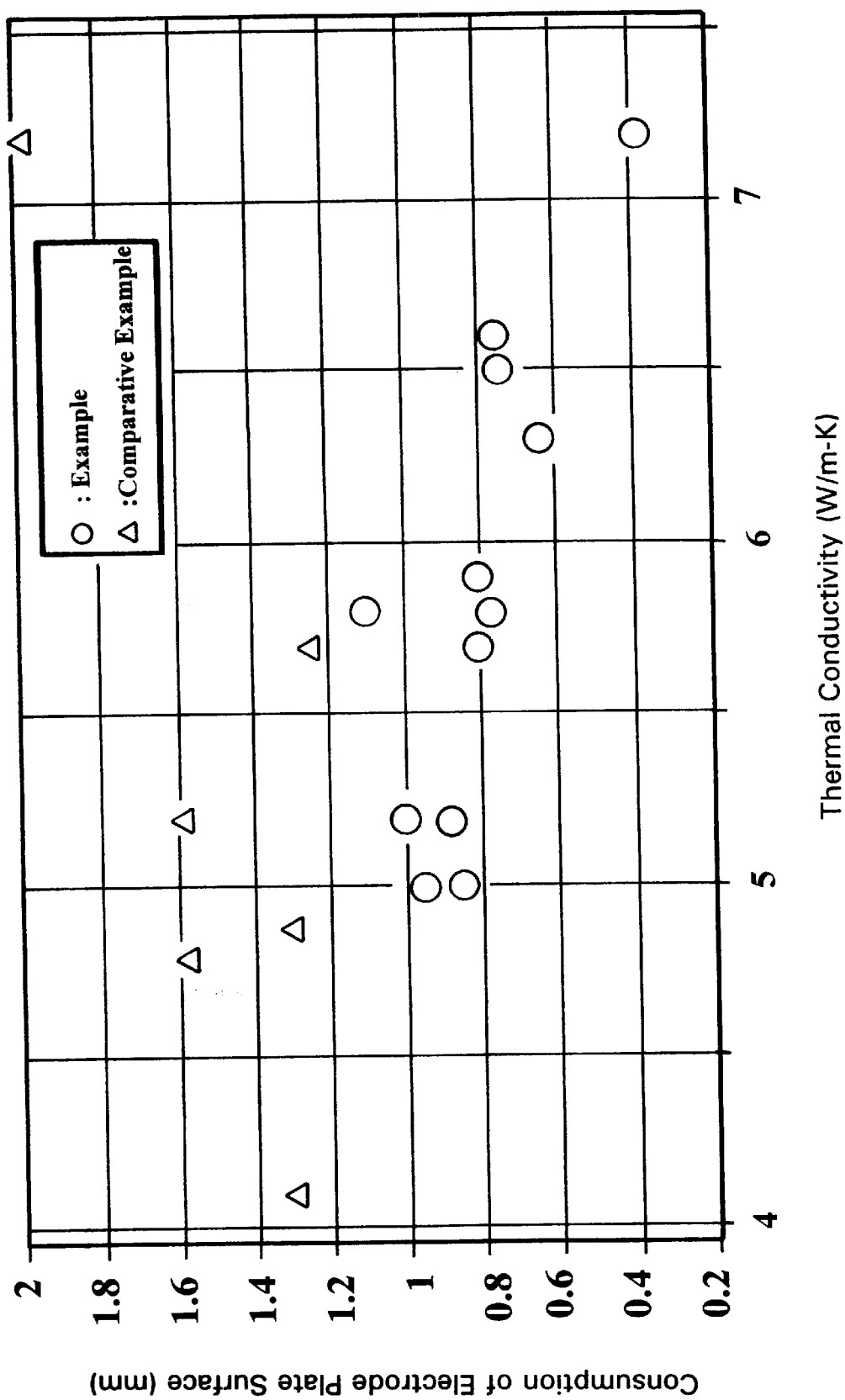
FIG. 2 is a graph showing the relationship between the thermal conductivity and the consumption of the electrode surface after etching for 200 hours.

The data in Tables 2 and 3 are plotted in FIGS. 1 and 2. FIG. 1 is a graph showing the relationship between the thermal conductivity and the uniformity of etch rate after etching for 200 hours. FIG. 2 is a graph showing the relationship between the thermal conductivity and the consumption of the electrode surface after etching for 200 hours. It is apparent that the samples meeting the requirements (a thermal conductivity higher than 5 W/m·K at 300K and a thickness larger than 4.5 mm) of the present invention are superior to the comparative samples in uniformity of etch rate (even after etching for a long time) and wear resistance of the electrode surface.

Figure 3:
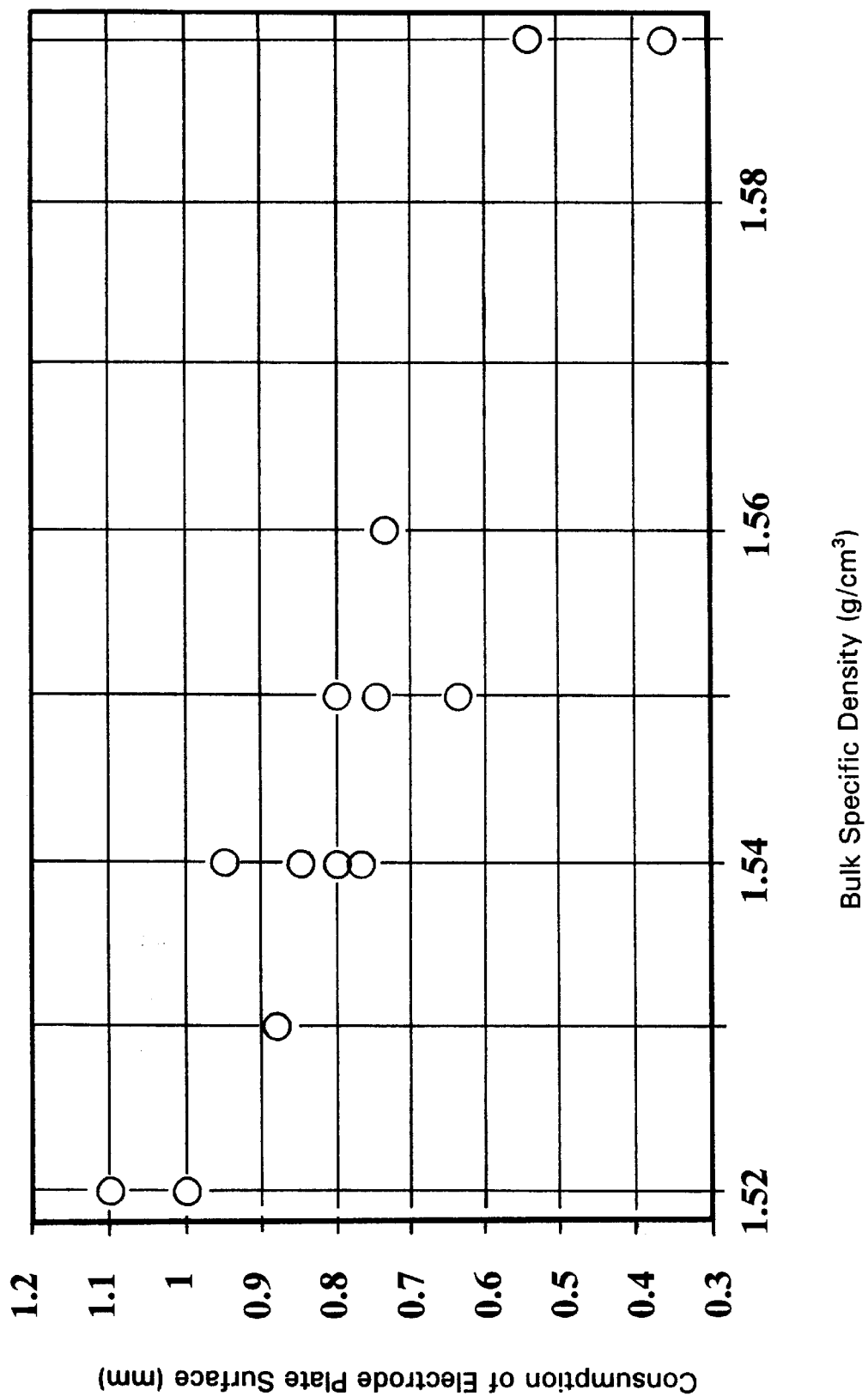
FIG. 3 is a graph showing the relationship between the bulk specific gravity and the consumption of the electrode surface after etching for 200 hours.

The data in Tables 2 and 3 are also plotted in FIG. 3. FIG. 3 is a graph showing the relationship between the bulk specific gravity and the consumption of the electrode surface after etching for 200 hours. It is apparent that the samples meeting the requirements (a bulk specific gravity higher than 1.53 g/cm$^3$) of the present invention are also superior in wear resistance as well as uniformity of etch rate.

As mentioned above, the plasma-etching electrode plate of the present invention is a glassy carbon plate characterized by having a thermal conductivity higher than a specific value at normal temperature and a thickness greater than a specific value. Due to these characteristic properties, it permits etching on large semiconductor wafers at a uniform etch rate. In addition, it is capable of stable etching for a long time and has a greatly improved durability. Therefore, the present invention is of great industrial value.

TABLE 1

| Example (Comparative Example) | Variable factors | | | |
|---|---|---|---|---|
| | Average molecular weight | Gelling time (min) | Furnace pressure (Torr) | Baking temperature (° C.) |
| 1 | 132 | 14 | 800 | 2000 |
| 2 | 132 | 14 | 1500 | 2000 |
| 3 | 132 | 14 | 800 | 2200 |
| 4 | 132 | 14 | 2000 | 2500 |
| 5 | 132 | 14 | 1500 | 2500 |
| 6 | 125 | 18 | 800 | 2000 |
| 7 | 125 | 18 | 800 | 2000 |
| 8 | 125 | 18 | 800 | 2500 |
| 9 | 125 | 18 | 2000 | 2000 |
| 10 | 125 | 18 | 2000 | 2500 |
| 11 | 125 | 18 | 800 | 1700 |
| 12 | 125 | 16 | 2000 | 1500 |
| 13 | 125 | 18 | 2000 | 1500 |
| (1) | 125 | 18 | 2000 | 1500 |
| (2) | 132 | 14 | 2000 | 2500 |
| (3) | 132 | 14 | 800 | 1400 |
| (4) | 125 | 18 | 800 | 2000 |
| (5) | 125 | 18 | 500 | 1700 |
| (6) | 125 | 18 | 800 | 1500 |

TABLE 2

| Example (Comparative Example) | Thermal conductivity (W/m · K) | Thickness (mm) | Bulk specific gravity (g/cc) | Diameter (mm) | Ratio of diameter to thickness |
|---|---|---|---|---|---|
| 1 | 5.2 | 4.5 | 1.52 | 300 | 67 |
| 2 | 5.9 | 5.0 | 1.55 | 300 | 60 |
| 3 | 5.8 | 5.0 | 1.52 | 380 | 76 |
| 4 | 7.2 | 8.0 | 1.59 | 380 | 48 |
| 5 | 6.6 | 6.0 | 1.55 | 380 | 63 |
| 6 | 5.8 | 6.0 | 1.54 | 300 | 50 |
| 7 | 5.7 | 6.2 | 1.54 | 390 | 63 |
| 8 | 6.5 | 5.0 | 1.56 | 500 | 60 |
| 9 | 6.3 | 6.0 | 1.55 | 200 | 33 |
| 10 | 7.2 | 6.0 | 1.59 | 300 | 50 |
| 11 | 5.2 | 5.0 | 1.53 | 300 | 60 |
| 12 | 5.0 | 5.0 | 1.54 | 300 | 60 |
| 13 | 5.0 | 5.0 | 1.54 | 380 | 76 |
| (1) | 5.2 | 4.0 | 1.51 | 300 | 75 |
| (2) | 7.2 | 4.0 | 1.58 | 380 | 95 |
| (3) | 4.1 | 5.0 | 1.53 | 300 | 60 |
| (4) | 5.7 | 4.1 | 1.53 | 300 | 73 |
| (5) | 4.9 | 3.5 | 1.50 | 200 | 57 |
| (6) | 4.8 | 4.1 | 1.51 | 300 | 73 |

TABLE 3

| Example (Comparative Example) | Uniformity of etch rate (%) at Initial stage | After etching for 100 hours | | After etching for 200 hours | |
|---|---|---|---|---|---|
| | | Uniformity of etch rate (%) | Consumption (mm) | Uniformity of etch rate (%) | Consumption (mm) |
| 1 | 3.1 | 3.2 | 0.65 | 3.4 | 1.00 |
| 2 | 2.6 | 2.5 | 0.39 | 2.8 | 0.80 |
| 3 | 3.0 | 3.2 | 0.79 | 3.3 | 1.10 |
| 4 | 2.4 | 2.5 | 0.17 | 2.7 | 0.37 |
| 5 | 2.5 | 2.7 | 0.36 | 2.8 | 0.75 |
| 6 | 3.1 | 3.3 | 0.36 | 3.5 | 0.77 |
| 7 | 2.8 | 2.9 | 0.38 | 3.3 | 0.80 |
| 8 | 2.7 | 2.8 | 0.35 | 3.1 | 0.74 |
| 9 | 2.6 | 2.9 | 0.31 | 3.2 | 0.64 |
| 10 | 2.2 | 2.2 | 0.30 | 2.5 | 0.55 |
| 11 | 3.0 | 3.2 | 0.43 | 3.3 | 0.88 |
| 12 | 3.3 | 3.5 | 0.46 | 3.5 | 0.85 |
| 13 | 3.4 | 3.5 | 0.55 | 3.8 | 0.95 |
| (1) | 4.1 | 5.3 | 0.79 | 6.5 | 1.60 |
| (2) | 3.7 | 4.6 | 0.97 | 5.2 | 1.98 |
| (3) | 5.5 | 7.2 | 0.51 | 8.5 | 1.30 |
| (4) | 4.2 | 4.4 | 0.61 | 4.7 | 1.25 |
| (5) | 4.6 | 5.1 | 0.64 | 5.2 | 1.30 |
| (6) | 4.4 | 4.7 | 0.75 | 4.9 | 1.58 |

What is claimed is:

1. A plasma-etching electrode plate of glassy carbon which is characterized by a thickness greater than 4.5 mm and a thermal conductivity greater than 5 W/m·K at 300K.

2. A plasma-etching electrode plate of glassy carbon as defined in claim 1, which is characterized by a bulk specific gravity greater than 1.53 g/cc.

3. A plasma-etching electrode plate of glassy carbon as defined in claim 1, which is formed from a thermosetting resin composition containing one or more thermosetting resins having a carbon yield higher than 20% and by the carbonization of a molded body of the thermosetting resin composition by heating the molded body at a temperature of 300–400° C. for more than five hours, 400–500° C. for more than five hours and 500–600° C. for more than five hours and heating at a temperature of 800–2500° C., to complete the carbonization.

4. The plasma-etching electrode plate of claim 3, wherein the thermosetting resin composition comprises a phenolic resin and furfuryl alcohol.

5. The plasma-etching electrode plate of claim 1, wherein said electrode plate has a total ash content less than 5 ppm, less than 2 ppm of metal impurities and less than 30 ppm total sulfur content.

* * * * *